United States Patent [19]

Ohnesorge

[11] Patent Number: 5,198,759
[45] Date of Patent: Mar. 30, 1993

[54] TEST APPARATUS AND METHOD FOR TESTING DIGITAL SYSTEM

[75] Inventor: Dieter Ohnesorge, Weil der Stadt, Fed. Rep. of Germany

[73] Assignee: Alcatel n.v., Amsterdam, Netherlands

[21] Appl. No.: 924,380

[22] Filed: Jul. 31, 1992

Related U.S. Application Data

[63] Continuation of Ser. No. 798,630, Nov. 26, 1991, abandoned.

[30] Foreign Application Priority Data

Nov. 27, 1990 [DE] Fed. Rep. of Germany ....... 4037687

[51] Int. Cl.$^5$ ............................................ G01R 31/28
[52] U.S. Cl. ................................. 324/158 R; 371/22.3
[58] Field of Search .............. 324/158 R, 73.1, 158 T; 371/22.1, 22.3, 25.1

[56] References Cited

U.S. PATENT DOCUMENTS

| | | | |
|---|---|---|---|
| 4,038,648 | 7/1977 | Chesley | 324/73.1 |
| 4,701,921 | 10/1987 | Powell et al. | 371/22.3 |
| 4,875,003 | 10/1989 | Burke | 371/25.1 |
| 4,947,357 | 8/1990 | Stewart et al. | 371/22.3 |
| 4,963,824 | 10/1990 | Hsieh et al. | 324/158 R |

OTHER PUBLICATIONS

Lee Whetsel, "A Proposed Standard Test Bus and Boundary Scan Architecture", Nov. 1988, pp. 1–5, Wescon 88/Conference Record.
IBM Technical Disclosure Bulletin, vol. 32, No. 4A, "Using a Portion of the Boundary Register as the Identification Register", Sep. 1989, pp. 262–264.
IEEE Standard 1149.1–1990, The Institute of Electrical and Electronics Engineers, Inc., New York, N.Y., USA, for Test Access Ports (TAP) and Boundary-Scan Architecture, 10 pages, approved Feb. 15, 1990, IEEE Standards Board.

Primary Examiner—Ernest F. Karlsen
Attorney, Agent, or Firm—Frishauf, Holtz, Goodman & Woodward

[57] ABSTRACT

A testing apparatus and method for testing of assemblies (BG1, BG2 . . . , BGn) in digital electronic systems, which permits a test on a system level without a fixed pre-setting of the number and position of the assemblies to be tested. On each assembly, control circuits are used for testing additional control circuits embodied as interfaces comprising two control units, one of which is assigned to a system scan bus, and the other of which is assigned to an assembly scan bus. The two control units can mutually exchange the active control function so that one unit is active at a given time. In this way it is possible to address a control unit of an assembly via the system scan bus without affecting the assembly scan bus which is connected with the deactivated other control unit. This arrangement first permits the individual assemblies to be selected by means of their slot position address and only thereafter to test them in a test operation. Neither the wiring of the system scan bus nor the test software need be changed if assemblies are removed or their positions are changed.

4 Claims, 3 Drawing Sheets

TEST APPARATUS AND METHOD FOR TESTING DIGITAL SYSTEM

This application is a continuation of application Ser. No. 07/798,630, filed Nov. 26, 1991, now abandoned.

BACKGROUND OF THE INVENTION

1. Field of the Invention

The invention relates to a test apparatus and a method for testing digital electronic systems.

More particularly, the present invention relates to a method and apparatus for testing assemblies forming an electronic digital system which permits testing of the integrated circuits forming each of the assemblies in the testing system to proceed even if the assemblies are misplaced in a testing facility or are missing from the test facility.

2. Description of the Prior Art

A prior art test apparatus has been described, for example, in IEEE Standard 1149.1- 1990 the entire contents of which is incorporated herein by reference. Particular reference is made to pages 1-3 through 1-5 and pages 5-1 through 5-5 of this publication. IEEE Standard 1149.1-1990 is a standard issued by the Institute of Electrical and Electronic Engineers, New York, N.Y., USA, for *Test Access Ports (TAP) and Boundary-Scan Architecture*, and is hereinafter referred to as "IEEE Standard". The test apparatus is used to test integrated circuits, assemblies and entire structural units of digital electronic systems for defects occurring within the integrated circuits used, as well as in the connection areas of the circuits with circuit boards as well as in the wiring of the test apparatus.

The principle of boundary scanning is employed in the IEEE Standard in which all connections of each integrated circuit are connected with the internal control of the integrated circuit via boundary scan cells integrated in the test apparatus assembly. The boundary scan cells are also controlled by an integrated control circuit which permits the parallel input of test data. The test data is serially input into the boundary scan cells, and into inputs of the integrated circuit. The integrated control circuits enable serial read out of data present at parallel outputs of the integrated circuit which are to be scanned.

The serial inputs and outputs which are connected to form assembly shift registers are switched in series for testing entire structural units, so that all integrated circuits of a structural unit, along with their connections with each other, can be tested via a single serial bus.

To shorten test operation times it is also possible to provide a plurality of serial buses, which respectively allow access to different groups of integrated circuits. The unnecessary interrogation of the boundary scan cells of integrated circuits which do not need to be tested can be avoided by providing bypass registers which are placed to bypass the control circuits of the integrated circuits and bridge the shift registers of the circuits which need not be tested.

A serial structure for a system scan bus using said IEEE Standard would be unsuitable for a higher order testing operation such as the testing of whole structural units with many assemblies, because in this case it would be necessary to pre-set the number of assembly spaces provided or to be provided with components and the positions of the assemblies using the existing test structure. Moreover, if a serial scan bus were used, a change in the number or positions of assemblies to be tested would require changes to the wiring of the scan bus and the test data generated for testing the assemblies to the adjust for the changed testing sequence. On the other hand, a parallel placement of the scan buses would also be disadvantageous, because the multiplication of the signal lines required would have to be designed for the maximum size of the system, so that too many signals would have to be provided on the plug side.

SUMMARY OF THE INVENTION

It is therefore an object of the present invention to provide an improved test apparatus of the above described species in such a way that testing of assemblies in whole structural units is possible in accordance with the previously mentioned IEEE Standard, even if assemblies of a structural unit are missing or are placed in alternately different slots.

It is another object of the present invention to provide a test apparatus which provides additional control circuit (STS) means designed as an interface between the assembly scan bus (BAB) and a higher-level system scan bus (SAB), and wherein if a predetermined assembly address which is predetermined by the current position of the assembly (BG1, BG2, . . . , BGn) in the system, matches a test address which is output via the system scan bus (SAB) to the control circuit (STS1) while the assembly scan bus (BAB) is disconnected from the system scan bus, then the scan bus of the respective assembly to be tested is connected to the system scan bus (SAB).

Another object of the present invention is to provide an additional control assembly which comprises two control units for controlling the assembly path (BAB). The two control units (STS1, STS2) are interconnected so that they can exchange active control function information and are associated with the system scan bus (SAB) and the assembly bus (BAB) respectively so that addressing while the assembly scan path is disconnected from the system bus provides flexibility and this enables the testing of the integrated circuits in the test apparatus regardless of their position.

It is another object of the present invention to provide a test apparatus which meets said IEEE Standard, and which permits testing of the systems even if some assemblies in the system are misplaced, without having to rewire the test rack or reprogram the test rack.

By using the additional control units (STS1, STS2) circuit on the assembly in the present invention as a controllable interface, one part of which is assigned to the system scan bus and the other part to the assembly scan bus, it becomes possible to select assemblies in a first step with the aid of a system scan bus actually used in the test apparatus, and to test the selected assembly using the assembly scan bus in a second step without affecting other assemblies.

DETAILED DESCRIPTION

Figure 1:
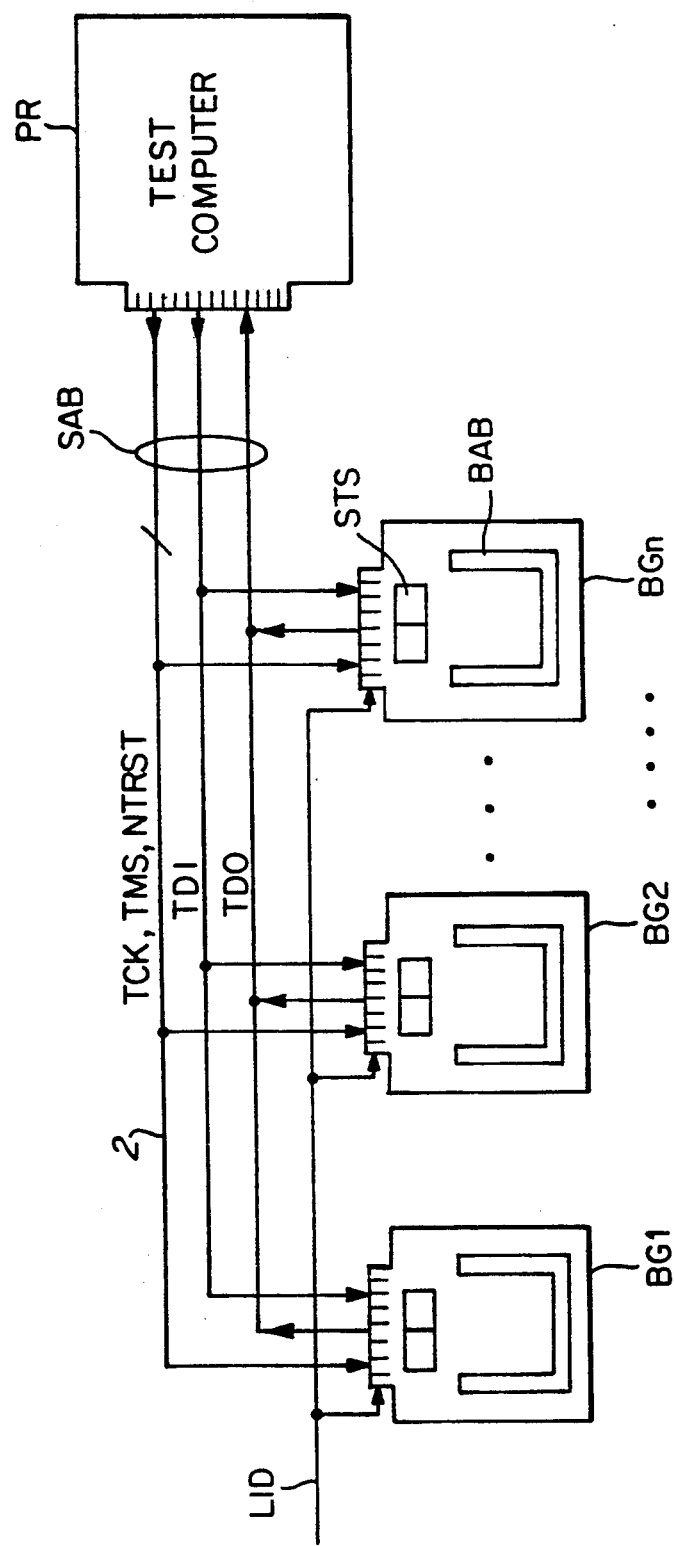
FIG. 1 is a block diagram of the test apparatus of the present invention.
Figure 2:
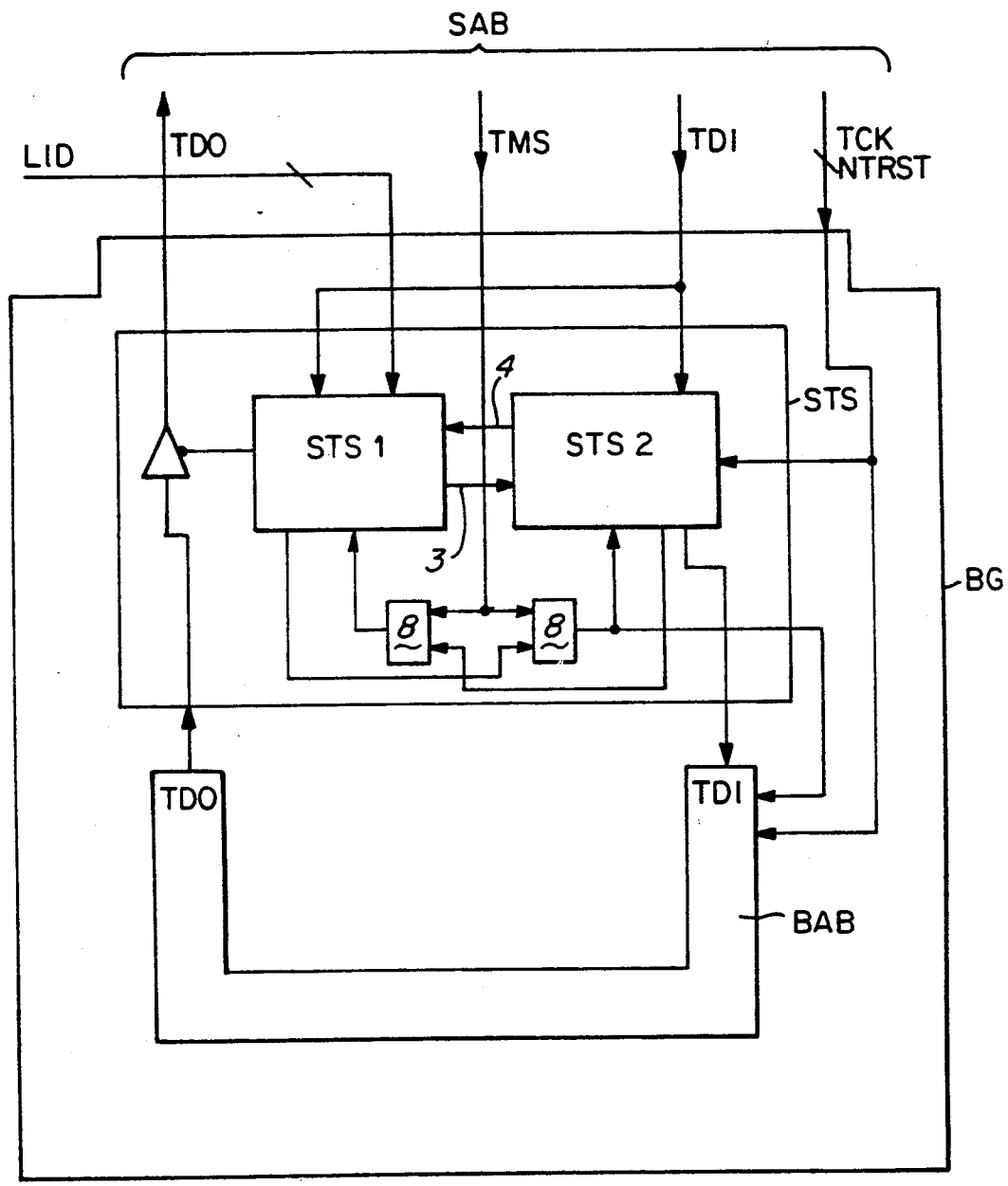
FIG. 2 shows a basic wiring diagram for a control circuit in an assembly of the present invention.

In FIG. 1, a number of assemblies BG1, ... BGn which are to be tested are shown. These assemblies are connected via a system scan bus SAB with a test computer PR. The system scan bus SAB, to which all assemblies are connected in parallel, has control lines including TMS, NTRST and a clock line TCK within control line 2 as well as a data input line TDI and a data output line TDO. The system scan bus SAB is connected to the assemblies BG-1 ... BGn with a respective control circuit STS. It is possible to assign an individual assembly address to each assembly by means of an identification feed line LID as shown in FIG. 2. The individual assemblies can be selected for interrogation by the test computer PR with the aid of their respective assembly addresses. Subsequently, the control circuit STS makes the connection between the system scan bus SAB and the respective serial assembly scan bus BAB, so that the test computer can perform the test operation for each assembly BG1 ... BGn.

An assembly BG with an assembly scan bus BAB and a control circuit STS is shown in FIG. 2. The control circuit STS is divided into a control unit STS1, assigned to the system scan bus SAB, and a control unit STS2, assigned to the assembly scan bus. The clock line TCK and the control line TMS of the system scan bus are fed to both control units (STS1, STS2). The two control units STS1, STS2 can activate or deactivate each other by means of AND elements (not shown) over leads 3 and 4 of FIG. 2. The assembly address is fed via the feed line LID only to the control unit STS1, assigned to the system scan bus SAB, because it alone is involved with the selection of the assemblies. However, the serial input to the assembly scan bus BAB is only connected with the control unit STS2, assigned to the assembly scan bus. The operation of the control circuit will be described below by means of the flow diagram in FIG. 3, or at times simultaneous therewith depending on certain commands. A bit in the serial input to the identification register can prevent deletion of data in the identification register or even writing of information in the identification register.

Following an initialization phase, both control units STS1, STS2 are in the "test-logic-reset" step S-1 mode, where the control unit STS1 controls the control unit STS2 (i.e., STS2 is deactivated). By means of affecting an internal TMS control via line 3, it is possible to prevent a mode change of the control unit STS2. This internally controlled TMS control via line 3 (FIG. 2) is made available to the components present in the assembly as their TMS line within the assembly scan bus BAB.

The control unit STS2 can affect the internal TMS control of the control unit STS1 in the same way.

Figure 3:
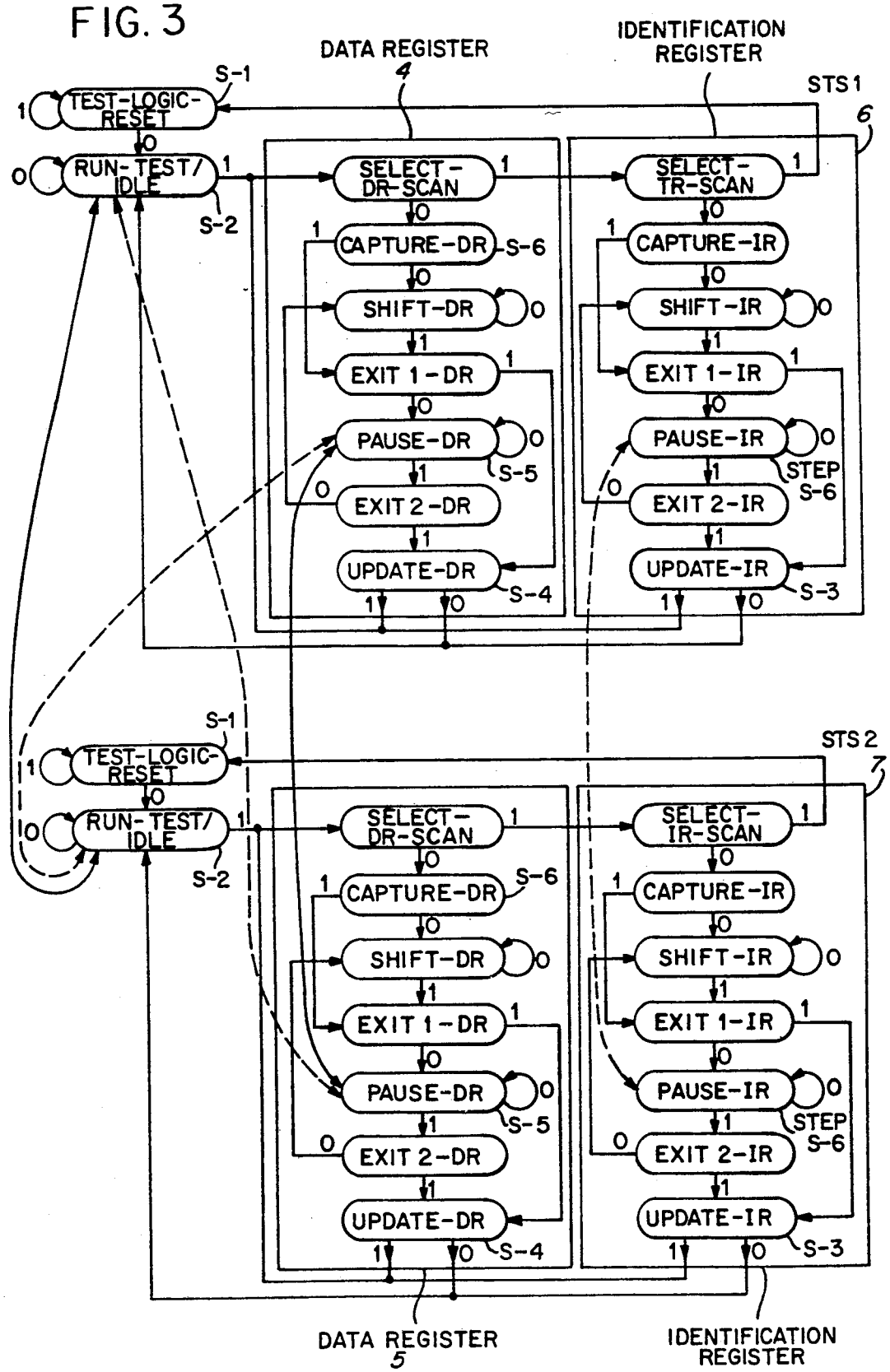
FIG. 3 shows a flow diagram for the operation of a control circuit.

The mutual switching of the respectively activated control units STS1, STS2 can take place principally in a "run-test/idle" (step S-2) of FIG. 3 or a "pause-DR" mode (step S-5) of FIG. 3. In principle, switching is also possible in a "pause-IR" mode (step S-6) of FIG. 3.

Referring to FIG. 3, the change of the active function as a rule takes place from one mode of one control unit into the same mode of the other control unit, for example, in accordance with the solid double-headed arrow from the "pause-DR" (step S-6) mode of FIG. 3 of the control unit STS2 to the "pause-DR" (step S-6) mode of FIG. 3 of the control unit STS1 or vice versa. In FIG. 3, the values "1" and "0" on the leads represents the signal present on the TMS line at the time of a rising edge of TCK. However, it is also possible to provide transitions between different modes of the two control units, for example in accordance with the dot-dash two-headed arrows from "pause-DR" (step S-5) of FIG. 3 of one unit to the "run-test/idle" (step S-2) of FIG. 3 mode of the other control unit. A schematic control sequence is as follows:

As shown in FIG. 3, the control unit STS1 comprises a data register 4 and an identification register 6. Similarly, the control unit STS2 comprises a data register 5 and an identification register 7. As indicated in FIG. 3 each of the data registers 4 and 5 are substantially similar to each other. Similarly, the information registers 6 and 7 are substantially similar to each other.

The terms in the blocks in FIG. 3 for each of the data registers in each of the identification registers are described in detail in FIG. 5-1 of said IEEE Standard and on pages 5-1 through 5-5 of said IEEE Standard. FIG. 5-1 of said IEEE Standard discloses a single data register and a single identification register. The present invention as shown in FIG. 3 shows a data register and an identification register in each of the control units STS1 and STS2. In FIG. 3, the data register and the identification register in control unit STS1 are associated with the system scan bus and the data register and the identification register in control unit STS2 are associated with the assembly scan bus. The FIG. 5-1 of said IEEE Standard further does not disclose the switch over between the registers in STS1 and the registers in STS2 of the present invention as shown in FIG. 3.

Thus, to summarize, control unit STS1 has a data register 4 and an identification register 6 and control unit STS2 has a data register 5 and an identification register 7 which are similar to those of control unit STS1. The data registers 4 and 5 in control units STS1 and STS2 store predetermined test assembly address information therein regarding the assembly and the integrated circuits therein to be tested. The identification register registers 6 and 7 store the current information regarding the actual integrated circuits position in the test assembly. If the identification information stored in the identification register matches with the predetermined previously stored test identification data stored in the data register, then the predetermined stored information can be used for further testing. Highlights of the testing steps are as follows:

Step S-1: Initialization (for example through the control line NTRST=0), both control units STS1, STS2 are in "test-logic-reset", mode (step S-1).

Step S-2: When TMS=0, both control units STS1, STS2 are the "run-test/idle" mode. Since following initialization the control unit STS1 is in control, the internal TMS line of the control unit STS2 is maintained at 0 (independently of the state of the lines TDI and TMS).

Step S-3: A read-in operation is now performed via the lines TMS, TMI in control line 2 of FIG. 2, which selects a certain assembly to be tested. To do this, the command "bypass", defined by said IEEE Standard is used, which now causes all control units active on the system scan bus SAB to provide identification data to the identification register (or optionally to the data register 4) following activation by the command step S-5 (update-IR). The identification data includes a control bit which, after having been set, can allow a multiple selection of assemblies, without deleting previously selected assemblies, from a number of identification bits necessary for the clear recognition of an assembly. The predetermined test identification characteristic of the assembly were provided in a suitable manner to the control unit STS1 and stored in data register 4 before step S-3 (the read in operation).

The serial data which is to be entered in the IR (identification register) 6 are entered via the line TDI (FIG. 1) and is evaluated in step S-4 in the "update-DR" mode (FIG. 3). If the identification data inserted in identification register 6 matches the predetermined test data stored in the data register, the latter is selected (or, if it was previously selected and the control bit was set to 0, it is deleted). Activation of the data output TDO may also occur with the selection; however, this can also take place at a later time if it is necessary for the functioning of the command, so that with multiple selections it can be assured that there is no conflict on the data output line TDO.

Step S-4: The control unit STS1 remains active until it is brought into a test mode, i.e., the "run-test/idle" mode (step S-2). At the time of transition into this (S-2) test mode, unit STS1 transfers the active control function to the control unit STS2; the internal TMS line of control unit STS2 is released and the TMS line control unit STS1 is blocked and the test system is directly connected with the assembly scan bus BAB. Once the test is finished, the active control function is again (switched) returned to the control unit STS1 via the "run-test/idle" mode (step S-2).

Certain commands (for example SAMPLE, EXT-EST) will cause the control unit STS2, via a MSB control bit, to remove the blocking of the control unit STS1, without the control unit STS2 being blocked. Thus both control units can change using the "pause-DR" mode (step S-5) so that the active control function subsequently can be issued again. This is necessary in order to be able to enter into the "capture-DR" mode (step S-6) for several assemblies simultaneously (with the same clock pulse TCK) and subsequently to read out data from the respective assembly scan buses from the "pause-DR" (step S-5) mode.

Step S-5: To end the test, the active control function is again transferred to the control unit STS1; this can also be caused by bringing the control unit STS2 into the "test-logic-reset" mode (step S-1).

Step S-6: The control unit STS1 can also be initialized by being brought into the "test-logic-reset" mode (step S-1).

The identification data can be read out by the control unit STS1 by means of a special command; this must be specified at the control unit STS1.

While the invention has been described with reference to the drawings and structures and methods disclosed herein, it is not confined to the details set forth, and is intended to cover modifications or changes as may come within the scope of the following claims.

I claim:

1. A digital electronic system testing apparatus for testing a plurality of electronic assemblies forming the system, each electronic assembly including a plurality of integrated circuits having leads for connecting the respective integrated circuit in the assembly, said leads respectively having boundary scan cells for testing the integrated circuits, the boundary scan cells of the leads of each integrated circuit being interconnected to form at least one shift register, each shift register having serial input means and serial output means and at least one clock line and one control line connected thereto from a control circuit, wherein the testing apparatus is capable of testing the assemblies even if some of the assemblies are missing or mispositioned, the testing apparatus comprising:

means for interconnecting the at least one shift register of said integrated circuits forming each assembly to form at least one scan bus;

means for interconnecting the thus formed at least one scan bus of at least one assembly together to form at least one assembly scan bus;

a system scan bus;

test computer means connected to said at least one assembly scan bus, via said system scan bus, for writing test data into and for reading test data out of said plurality of integrated circuits of an assembly, and for sending test address data to said assemblies;

an additional control means in each assembly and operating as an interface between said system scan bus and said assembly scan bus, said additional control means being coupled between said at least one assembly scan bus and said system scan bus, said additional control means including:

switching means for controllably disconnecting said system scan bus from said assembly scan bus;

storage means for storing predetermined unique address data which uniquely identifies each assembly in the test apparatus; and comparing means for comparing said address data stored in said storage means with said test address data sent on said system scan bus;

said switching means including means for connecting said assembly scan bus to said system scan bus when said comparing means determines, at a time when said system scan bus and said assembly scan bus are disconnected, that said address data in said storage means matches test address data.

2. The testing apparatus according to claim 1, wherein:

said additional control means each comprises first and second control units respectively associated with said system scan bus and said assembly scan bus;

each of said first and second control units being capable of deactivating the other control unit;

said first control unit associated with said system scan bus including said storage means, said storage means comprising:

a data register for storing the unique address data identifying the assembly;

an identification register for storing position data of the assembly to be tested; and said position data being provided to the identification register from said system scan bus in response to test address data during a reading operation which precedes a test operation;

said second control unit associated with said assembly scan bus being disconnected by said switching means from said system scan bus during a reading operation;

and wherein when said comparing means determines that position data stored in said identification register matches said unique address data stored in said data register, said second control unit associated with said assembly scan bus is activated by said first control unit associated with said system scan bus to connect said assembly scan bus to said system scan bus to permit testing of the plurality of integrated circuits in the assembly to be tested with test data from said test computer means.

3. The testing apparatus according to claim 2, wherein:
said position data stored in said identification register includes a data bit which if present will prevent deletion or overwriting of data stored in said identification register.

4. A method for testing a digital electronic system comprising a plurality of electronic assemblies which form the system, each electronic assembly including a plurality of integrated circuits respectively having leads for interconnecting the integrated circuits in the assembly, said leads having boundary scan cells for testing the integrated circuits, and wherein the boundary scan cells of the leads of each integrated circuit are interconnected to form at least one shift register, each shift register having a serial input means and a serial output means, and each shift register further having at least one clock lead and one control lead thereof connected to a control circuit, said testing method permitting testing of assemblies even if some of the assemblies are missing or mispositioned during the testing of the system, the steps comprising:
interconnecting the at least one shift register of said integrated circuits forming each assembly to form at least one scan bus;
interconnecting the thus formed scan buses of at least one assembly to form at least one assembly scan bus;
connecting test computer means to said at least one of said assemblies, via a system scan bus, for writing test data into and for reading data out of said integrated circuits in an assembly to be tested, and for sending test address data to said assemblies;
providing, at each assembly, an additional control means between said at least one assembly scan bus of an assembly to be tested and said system scan bus, said additional control means including:
first and second storage means; and
switching means for controllably disconnecting said system scan bus from said assembly scan bus;
disconnecting said system scan bus from said assembly scan bus with said controllable switching means before testing is to begin;
storing predetermined unique address data which uniquely identifies the assembly to be tested, in said first storage means;
storing test address data in said second storage means; said test address data being received from said test computer means via said system scan bus;
comparing the data stored in said the first and second storage means; and
connecting said assembly scan bus to said system scan bus when the comparing step indicates that data stored in said first and second storage means matches each other.

* * * * *